United States Patent
Yousef et al.

(10) Patent No.: US 7,697,644 B2
(45) Date of Patent: Apr. 13, 2010

(54) STEPPED AUTOMATIC GAIN CONTROL FOR OFDM SYSTEMS

(75) Inventors: Nabil Yousef, Foothill Ranch, CA (US); Aly Ismail, Irvine, CA (US); Edward Youssoufian, Irvine, CA (US)

(73) Assignee: Newport Media, Inc., Lake Forest, CA (US)

(*) Notice: Subject to any disclaimer, the term of this patent is extended or adjusted under 35 U.S.C. 154(b) by 713 days.

(21) Appl. No.: 11/565,003

(22) Filed: Nov. 30, 2006

(65) Prior Publication Data
US 2008/0130799 A1   Jun. 5, 2008

(51) Int. Cl.
*H04L 27/08* (2006.01)
(52) U.S. Cl. .............. 375/345; 375/260; 375/316; 375/340; 375/349
(58) Field of Classification Search ........... 375/345, 375/260, 316, 340, 349
See application file for complete search history.

(56) References Cited

U.S. PATENT DOCUMENTS

| | | | |
|---|---|---|---|
| 2002/0181509 A1* | 12/2002 | Mody et al. | 370/480 |
| 2003/0107986 A1* | 6/2003 | Malkemes et al. | 370/208 |
| 2004/0184399 A1 | 9/2004 | Chiou | |
| 2004/0218519 A1 | 11/2004 | Chiou et al. | |
| 2005/0141413 A1 | 6/2005 | Hoshino | |
| 2006/0193410 A1* | 8/2006 | Moorti et al. | 375/347 |
| 2006/0222118 A1 | 10/2006 | Murthy | |

* cited by examiner

*Primary Examiner*—Ted M Wang
(74) *Attorney, Agent, or Firm*—Rahman LLC

(57) ABSTRACT

A system and method for performing stepped automatic gain control (AGC) for orthogonal-frequency-division-multiplexing (OFDM) applications comprises a radio frequency (RF) tuner and an OFDM demodulator operatively connected to the RF tuner, the OFDM demodulator comprising logic circuitry adapted to (i) detect OFDM symbols from a stream of data; (ii) detect boundaries of the OFDM symbols; (iii) detect a cyclic prefix duration of data values associated with the OFDM symbols; and (iv) provide a feedback to the RF tuner of the information pertaining to the boundaries of the OFDM symbols and the cyclic prefix duration.

20 Claims, 3 Drawing Sheets

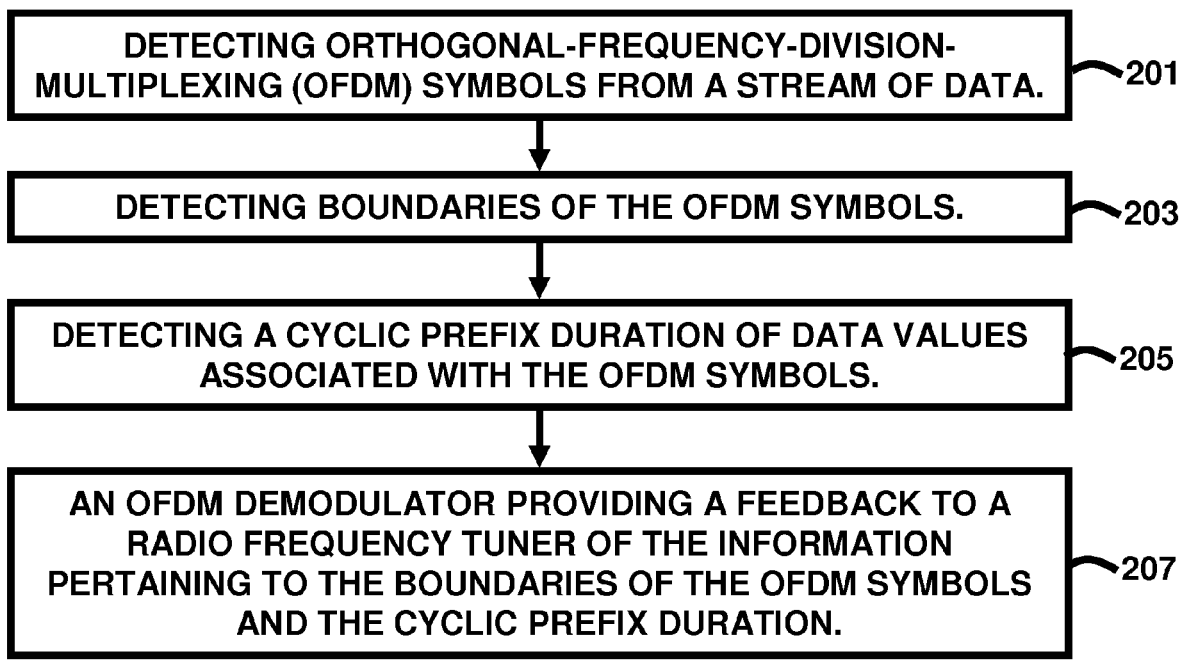

STEPPED AUTOMATIC GAIN CONTROL FOR OFDM SYSTEMS

BACKGROUND

1. Technical Field

The embodiments herein generally relate to wireless communication systems, and, more particularly, to downconversion in radio frequency (RF) receivers.

2. Description of the Related Art

In wireless communication systems, automatic gain control (AGC) is used to adjust the gain of the receiver to overcome the large variation in the received signal level. The variable gain low noise amplifier (LNA) and variable gain amplifier (VGA) could be designed in two different ways. The first is to have a linear gain response. In other words, the LNA and VGA should be able to have a gain that is directly proportional to the control voltage with the same proportion for all values of the input voltage. The second is to have a stepped gain response. In other words, the LNA and VGA have only a few discrete values for the gain. Switching from one gain value to another depends on the value of the control voltage. A stepped gain response leads to a much simpler implementation and a much lower power consumption for both the LNA and VGA. However, stepped gain response could cause significant glitches and a rather large gain discontinuity to the received signal, which generally does not happen with a linear gain response.

In orthogonal-frequency-division-multiplexing (OFDM) systems, a stepped gain response generally cannot be tolerated as any glitch or sudden change in the signal level may cause the loss of an entire OFDM symbol. This could lead to a significant loss of data, especially in the case of long OFDM symbols that are normally used in terrestrial television (TV) applications. In such applications, the length of one OFDM symbol could be as long as one millisecond. Accordingly, stepping the gain suddenly within any portion of an OFDM symbol could lead to the loss of the entire symbol. Therefore, there remains a need for a technique for enabling the use of stepped gain amplifiers for OFDM systems without any loss in performance.

SUMMARY

In view of the foregoing, an embodiment herein provides a system for performing stepped AGC for OFDM applications, wherein the system comprises a RF tuner and an OFDM demodulator operatively connected to the RF tuner, the OFDM demodulator comprising logic circuitry adapted to (i) detect OFDM symbols from a stream of data; (ii) detect boundaries of the OFDM symbols; (iii) detect a cyclic prefix duration of data values associated with the OFDM symbols; and (iv) provide a feedback to the RF tuner of the information pertaining to the boundaries of the OFDM symbols and the cyclic prefix duration. Preferably, the RF tuner comprises a variable gain LNA adapted to amplify a RF signal being input into the RF tuner; a local oscillator adapted to generate a signal carrier; a mixer operatively connected to the LNA and the local oscillator, wherein the mixer is adapted to mix the RF signal with the signal carrier to create a baseband signal; a filter operatively connected to the mixer, wherein the filter is adapted to filter the baseband signal; and a VGA operatively connected to the filter, wherein the VGA is adapted to amplify the filtered baseband signal.

The system may further comprise an analog-to-digital converter (ADC) operatively connected to the VGA, wherein the ADC is adapted to convert the filtered baseband signal to a digital signal. Moreover, the LNA and the VGA are each preferably adapted to use information pertaining to the boundaries of the OFDM symbols to change a stepped gain in each of the LNA and the VGA only during the cyclic prefix duration. Furthermore, the change in the stepped gain is preferably sudden and large, wherein the change in the stepped gain preferably comprises a duration of a step function and is in the range of approximately 1-20 dB gain steps during the cyclic prefix duration. Additionally, the system may further comprise a system on chip (SoC) comprising the RF tuner and the OFDM demodulator.

Another embodiment herein provides a SoC device adapted to perform stepped AGC for OFDM applications, wherein the SoC device comprises a RF tuner and an OFDM demodulator operatively connected to the RF tuner, the OFDM demodulator comprising logic circuitry adapted to (i) detect OFDM symbols from a stream of data; (ii) detect boundaries of the OFDM symbols; (iii) detect a cyclic prefix duration of data values associated with the OFDM symbols; and (iv) provide a feedback to the RF tuner of the information pertaining to the boundaries of the OFDM symbols and the cyclic prefix duration. Preferably, the RF tuner comprises a variable gain LNA adapted to amplify a RF signal being input into the RF tuner; a local oscillator adapted to generate a signal carrier; a mixer operatively connected to the LNA and the local oscillator, wherein the mixer is adapted to mix the RF signal with the signal carrier to create a baseband signal; a filter operatively connected to the mixer, wherein the filter is adapted to filter the baseband signal; and a VGA operatively connected to the filter, wherein the VGA is adapted to amplify the filtered baseband signal.

Preferably, the LNA and the VGA are each adapted to use information pertaining to the boundaries of the OFDM symbols to change a stepped gain in each of the LNA and the VGA only during the cyclic prefix duration. Moreover, the change in the stepped gain is preferably sudden and large, wherein the change in the stepped gain preferably comprises a duration of a step function and is in the range of approximately 1-20 dB gain steps during the cyclic prefix duration.

Another embodiment provides a method of performing stepped AGC for an OFDM system comprising a RF tuner operatively connected to an OFDM demodulator, wherein the method comprises detecting OFDM symbols from a stream of data; detecting boundaries of the OFDM symbols; detecting a cyclic prefix duration of data values associated with the OFDM symbols; and the OFDM demodulator providing a feedback to the RF tuner of the information pertaining to the boundaries of the OFDM symbols and the cyclic prefix duration. The method may further comprise amplifying, using a variable gain LNA, a RF signal being input into the RF tuner; generating a signal carrier; creating a baseband signal by mixing the RF signal with the signal carrier; filtering the baseband signal; and amplifying, using a VGA, the filtered baseband signal.

Moreover, the method may further comprise converting the filtered baseband signal to a digital signal. Preferably, the LNA and the VGA are each adapted to use information pertaining to the boundaries of the OFDM symbols to change a stepped gain in each of the LNA and the VGA only during the cyclic prefix duration. Preferably, the change in the stepped gain is sudden and large, wherein the change in the stepped gain comprises a duration of a step function and is in the range of approximately 1-20 dB gain steps during said cyclic prefix duration. Additionally, the method may further comprise integrating the RF tuner and the OFDM demodulator on a SoC device, wherein the integration of the RF tuner and the OFDM demodulator on the SoC device preferably causes the OFDM demodulator to control the LNA and the VGA gain digitally without requiring a conversion of an AGC control to analog, and wherein the integration achieves a power consumption and chip die size savings of approximately 10-25% compared with non-integration.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 4 is a flow diagram illustrating a preferred method according to an embodiment herein.

DETAILED DESCRIPTION OF PREFERRED EMBODIMENTS

Figure 1:
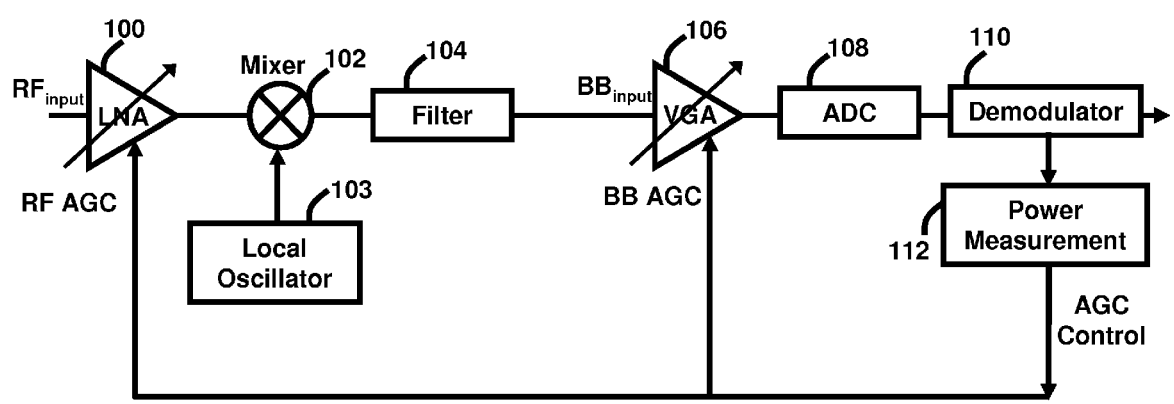
FIGS. 1 and 2 illustrate schematic block diagrams of a AGC operation according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a technique for enabling the use of stepped gain amplifiers for OFDM systems without any loss in performance. The embodiments herein achieve this by providing a cyclic prefix technique to facilitate the use of stepped gain responses in OFDM systems. Referring now to the drawings, and more particularly to FIGS. 1 through 4, where similar reference characters denote corresponding features consistently throughout the figures, there are shown preferred embodiments.

FIG. 1 illustrates a simplified block diagram of AGC operation. The received RF signal is first amplified with a variable gain low noise amplifier (LNA) 100. The RF signal is mixed (in mixer 102) with a carrier generated from a local oscillator 102 to get a baseband (BB) signal. Thereafter, the baseband signal is filtered (in filter 104) and amplified using a variable gain amplifier (VGA) 106. Next, the analog baseband signal is converted to a digital signal using an analog to digital converter (ADC) 108. Then, the digital signal is demodulated by a demodulator 110. The overall gain of the system (LNA and VGA gains) is adjusted such that the signal level after the ADC is at a certain desired level. In order to accomplish this, the demodulator 110 measures the received signal level and compares (shown in block 112 in FIG. 1) it to the desired level. The demodulator 110 then feeds back two voltage signals to control the gains of the LNA 100 and VGA 106 (RF and BB AGC).

As indicated in FIGS. 1 through 4, in order to enable stepped gain changes in OFDM systems, the embodiments herein exploit a property of OFDM symbols. OFDM symbols are constructed by performing an N point inverse Fourier transform (IFFT) operation on a vector of N data samples. The output vector of N complex values is stored in a buffer, which is part of the IFFT operation itself, and the last L complex values of this vector are either pre-pended or post-pended to the IFFT output vector. When a vector of data is pre-pended, the added data is added at the beginning of the vector. If, it is post-pended, the added data is added at the end of the vector. The repeated L values are called the cyclic prefix (CP) when they are pre-pended. The CP also serves as a guard interval against inter-symbol-interference (ISI) that could happen in multipath channels. Since the CP contains redundant information, it could be thrown away at a receiver. The CP is at the start of the symbol and it is longer than the channel length. Thus, the CP will be corrupted by the previous symbol. If the receiver throws it away then no ISI occurs. At the receiver, the CP is neglected as it could be corrupted by ISI. The CP is of known length and it is at the beginning of every symbol. Once the receiver knows the symbol start point, it can distinguish the CP. Thus, any sudden gain change during the CP period will not affect the performance as the receiver simply ignores the CP.

According to the embodiments herein, the OFDM demodulator 110 detects the OFDM symbol boundaries and cyclic prefix duration 114. The manner in which this occurs is well-known to those skilled in the art. The general idea is that the receiver uses the fact that the CP is identical to the last portion of the symbol. The symbol boundaries are usually detected by correlating the received signal with a delayed version of itself for the duration of the CP. When the CP passes through this correlator it will correlate well. However, any other part of the OFDM signal will not correlate well. The demodulator 110 feeds this information back to the RF tuner 105. The LNA 100 and VGA 106 use the symbol boundary information to change their gain in steps 116, 118 only during the cyclic prefix duration. The LNA 100 and VGA 106 store the gain control changes and wait for the CP to happen and will only apply the gain changes at this instant. This enables the LNA 100 and VGA 106 to be completely stepped without any degradation in performance. The stepped gain takes only discrete gain values and can be switched without continuity.

Figure 3:
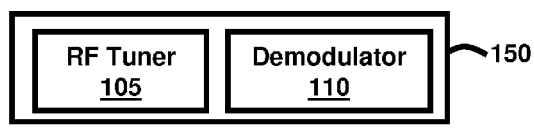
FIG. 3 illustrates a schematic diagram of a system on chip device according to an embodiment herein.

The LNA 100 and VGA 106 can make sudden (the duration of a step function) and large (typically in the range of 1-20 dB) gain steps during the CP duration. For example, a typical case involves steps of 6 dB and a dynamic range of 36 dB for the LNA 100 and 60 dB for the VGA 106. Thus, the gain could be corrected in just one step. This leads to very fast AGC operation that could track fast channel gain changes. In this regard, the speed of the AGC is the step/symbol duration. In DVB-H applications, this is approximately 6 dB/1 msec. When the RF tuner 105 and the OFDM demodulator 110 are both integrated on a system on chip (SoC) 150, as shown in FIG. 3, the demodulator AGC circuits 110 could control the LNA 110 and VGA 106 gain digitally without the need to convert the AGC control to analog (i.e., without the need for ADC 108). This saves power consumption (approximately 10-25%) and die size (approximately 10-25%).

Figure 2:
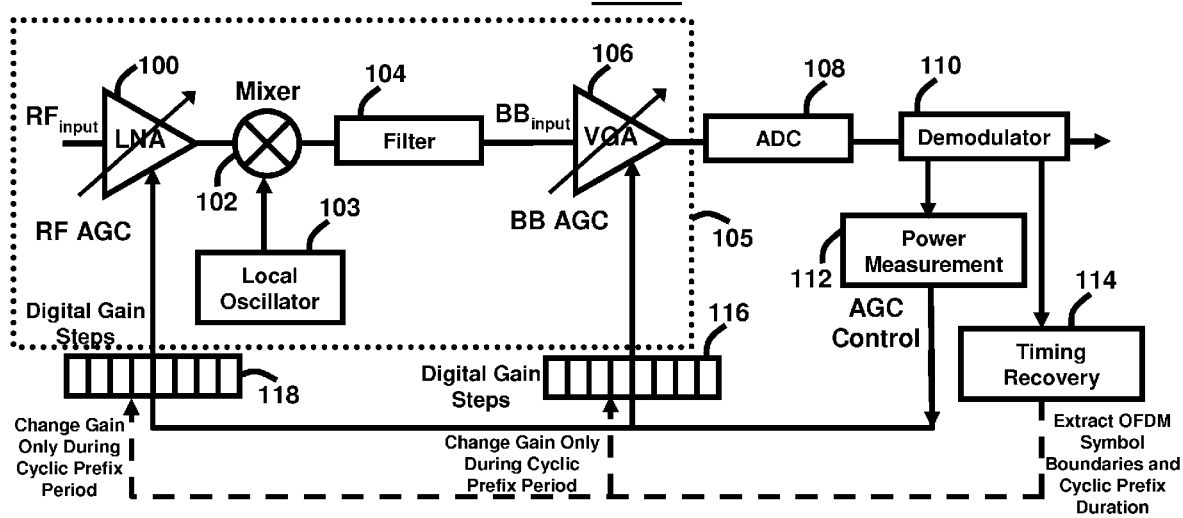

FIG. 4, with reference to FIGS. 1 through 3, is a flow diagram illustrating a method of performing stepped AGC for an OFDM system comprising a RF tuner 105 operatively connected to an OFDM demodulator 110 according to an embodiment herein, wherein the method comprises detecting (201) OFDM symbols from a stream of data; detecting (203) boundaries of the OFDM symbols; detecting (205) a cyclic prefix duration of data values associated with the OFDM symbols; and the OFDM demodulator 110 providing (207) a feedback to the RF tuner 105 of the information pertaining to the boundaries of the OFDM symbols and the cyclic prefix duration.

The method may further comprise amplifying, using a variable gain LNA 100, a RF signal being input into the RF tuner 105; generating a signal carrier; creating a baseband signal by mixing the RF signal with the signal carrier; filtering the baseband signal; and amplifying, using a VGA 106, the filtered baseband signal. Moreover, the method may further comprise converting the filtered baseband signal to a digital signal. Preferably, the LNA 100 and the VGA 106 are each adapted to use information pertaining to the boundaries of the OFDM symbols to change a stepped gain in each of the LNA 100 and the VGA 106 only during the cyclic prefix duration. Preferably, the change in the stepped gain is sudden and large wherein the change in the stepped gain comprises a duration of a step function and is in the range of approximately 1-20 dB gain steps during said cyclic prefix duration.

Additionally, the method may further comprise integrating the RF tuner 105 and the OFDM demodulator 110 on a SoC device 150, wherein the integration of the RF tuner 105 and the OFDM demodulator 110 on the SoC device 150 preferably causes the OFDM demodulator 110 to control the LNA 100 and the VGA 106 gain digitally without requiring a conversion of an AGC control to analog, and wherein the integration achieves a power consumption and chip die size savings of approximately 10-25% compared with non-integration.

The embodiments herein can also apply to amplifiers constructed in different technologies than complementary metal oxide semiconductor (CMOS) such as bipolar complementary metal oxide semiconductor (BICMOS), silicon germanium (SiGe), bipolar, and gallium arsenide (GaAs) technologies. Furthermore, the embodiments herein can also be used for different applications other than wireless receivers in order to obtain low noise amplifiers.

The embodiments herein may be fabricated on an integrated circuit chip (such as SoC device 150). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips (such as SoC device 150) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Generally, the embodiments herein can be used in the design/implementation of any receiver (wireless, TV tuner, modems), and provides a technique to achieve low current highly linear CMOS downconverting mixers for RF receivers.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system for performing stepped automatic gain control (AGC) for orthogonal-frequency-division-multiplexing (OFDM) applications, said system comprising:
   a radio frequency (RF) tuner comprising:
      a variable gain low noise amplifier (LNA) adapted to amplify a RF signal being input into said RF tuner;
      a local oscillator adapted to generate a signal carrier;
      a mixer operatively connected to said LNA and said local oscillator, wherein said mixer is adapted to mix said RF signal with said signal carrier to create a baseband signal;
      a filter operatively connected to said mixer, wherein said filter is adapted to filter said baseband signal; and
      a variable gain amplifier (VGA) operatively connected to said filter, wherein said VGA is adapted to amplify the filtered baseband signal;
   an OFDM demodulator operatively connected to said RF tuner, said OFDM demodulator comprising logic circuitry adapted to (i) detect OFDM symbols from a stream of data; (ii) detect boundaries of said OFDM symbols; (iii) detect a cyclic prefix duration of data values associated with said OFDM symbols; and (iv) provide a feedback to said RF tuner of said information pertaining to said boundaries of said OFDM symbols and said cyclic prefix duration,
   wherein said LNA and said VGA are each adapted to use information pertaining to said boundaries of said OFDM symbols to change a stepped gain in each of said LNA and said VGA only during said cyclic prefix duration.

2. The system of claim 1, further comprising an analog-to-digital converter (ADC) operatively connected to said VGA, wherein said ADC is adapted to convert said filtered baseband signal to a digital signal.

3. The system of claim 1, further comprising a wireless receiver comprising said RF tuner and said OFDM demodulator.

4. The system of claim 1, wherein said change in said stepped gain is sudden and large.

5. The system of claim 4, wherein said change in said stepped gain comprises a duration of a step function and is in the range of approximately 1-20 dB gain steps during said cyclic prefix duration.

6. The system of claim 1, further comprising a system on chip (SoC) comprising said RF tuner and said OFDM demodulator.

7. The system of claim 6, wherein an integration of said RF tuner and said OFDM demodulator on said SoC causes said OFDM demodulator to control said LNA and said VGA gain digitally without requiring a conversion of an AGC control to analog.

8. The system of claim 7, wherein said integration achieves a power consumption and chip die size savings of approximately 10-25% compared with non-integration.

9. A system on chip (SoC) device adapted to perform stepped automatic gain control (AGC) for orthogonal-frequency-division-multiplexing (OFDM) applications, said SoC device comprising:
a radio frequency (RF) tuner comprising:
a variable gain low noise amplifier (LNA) adapted to amplify a RF signal being input into said RF tuner;
a local oscillator adapted to generate a signal carrier;
a mixer operatively connected to said LNA and said local oscillator, wherein said mixer is adapted to mix said RF signal with said signal carrier to create a baseband signal;
a filter operatively connected to said mixer, wherein said filter is adapted to filter said baseband signal; and
a variable gain amplifier (VGA) operatively connected to said filter, wherein said VGA is adapted to amplify the filtered baseband signal;
an OFDM demodulator operatively connected to said RF tuner, said OFDM demodulator comprising logic circuitry adapted to (i) detect OFDM symbols from a stream of data; (ii) detect boundaries of said OFDM symbols; (iii) detect a cyclic prefix duration of data values associated with said OFDM symbols; and (iv) provide a feedback to said RF tuner of said information pertaining to said boundaries of said OFDM symbols and said cyclic prefix duration,
wherein said LNA and said VGA are each adapted to use information pertaining to said boundaries of said OFDM symbols to change a stepped gain in each of said LNA and said VGA only during said cyclic prefix duration.

10. The SoC device of claim 9, further comprising an analog-to-digital converter (ADC) operatively connected to said VGA, wherein said ADC is adapted to convert said filtered baseband signal to a digital signal.

11. The SoC device of claim 10, wherein an integration of said RF tuner and said OFDM demodulator on said SoC device causes said OFDM demodulator to control said LNA and said VGA gain digitally without requiring a conversion of an AGC control to analog, and wherein said integration achieves a power consumption and chip die size savings of approximately 10-25% compared with non-integration.

12. The SoC device of claim 9, wherein said change in said stepped gain is sudden and large.

13. The SoC device of claim 9, wherein said change in said stepped gain comprises a duration of a step function and is in the range of approximately 1-20 dB gain steps during said cyclic prefix duration.

14. A method of performing stepped automatic gain control (AGC) for an orthogonal-frequency-division-multiplexing (OFDM) system comprising a radio frequency (RF) tuner operatively connected to an OFDM demodulator, said method comprising:
amplifying, using a variable gain low noise amplifier (LNA), a RF signal being input into said RF tuner;
generating a signal carrier;
creating a baseband signal by mixing said RF signal with said signal carrier;
filtering said baseband signal;
amplifying, using a variable gain amplifier (VGA), the filtered baseband signal;
detecting OFDM symbols from a stream of data;
detecting boundaries of said OFDM symbols;
detecting a cyclic prefix duration of data values associated with said OFDM symbols; and
said OFDM demodulator providing a feedback to said RF tuner of said information pertaining to said boundaries of said OFDM symbols and said cyclic prefix duration,
wherein said LNA and said VGA are each adapted to use information pertaining to said boundaries of said OFDM symbols to change a stepped gain in each of said LNA and said VGA only during said cyclic prefix duration.

15. The method of claim 14, further comprising integrating said RF tuner and said OFDM demodulator in a wireless receiver.

16. The method of claim 14, further comprising convening said filtered baseband signal to a digital signal.

17. The method of claim 14, wherein said change in said stepped gain is sudden and large.

18. The method of claim 14, wherein said change in said stepped gain comprises a duration of a step function and is in the range of approximately 1-20 dB gain steps during said cyclic prefix duration.

19. The method of claim 14, further comprising integrating said RF tuner and said OFDM demodulator on a system on chip (SoC) device.

20. The method of claim 19, wherein the integration of said RF tuner and said OFDM demodulator on said SoC device causes said OFDM demodulator to control said LNA and said VGA gain digitally without requiring a conversion of an AGC control to analog, and wherein said integration achieves a power consumption and chip die size savings of approximately 10-25% compared with non-integration.

* * * * *